United States Patent [19]

Howard

[11] 4,114,091
[45] Sep. 12, 1978

[54] APPARATUS FOR MATCHING WIRES IN MULTIPLE WIRE CONDUCTORS AND ATTENDANT METHOD

[75] Inventor: James Lynn Howard, Lancaster, S.C.

[73] Assignee: Earl Cooper Phifer, Stanfield, N.C.; a part interest

[21] Appl. No.: 799,379

[22] Filed: May 23, 1977

Related U.S. Application Data

[63] Continuation-in-part of Ser. No. 673,660, Apr. 5, 1976, Pat. No. 4,041,383.

[51] Int. Cl.² ................... G01R 31/02; G01R 1/06
[52] U.S. Cl. ............................. 324/66; 324/51; 324/149
[58] Field of Search ............... 324/51, 53, 66, 72.5, 324/133, 149

[56] References Cited

FOREIGN PATENT DOCUMENTS 697,542  11/1964  Canada ............... 324/53
587,036  4/1947   United Kingdom ... 324/53
130,580  11/1959  U.S.S.R. ............. 324/66

OTHER PUBLICATIONS

Watson, S. G., Polarity Reversing Test Probes, I.B.M. Tech. Discl. Bulletin, vol. 16, No. 3, Aug. 1973, p. 836.

Primary Examiner—Gerard R. Strecker
Attorney, Agent, or Firm—Bell, Seltzer, Park & Gibson

[57] ABSTRACT

The corresponding opposite end portions of wires at opposite ends of a multi-wire conductor are matched in accordance with this invention with the use of a direct current circuit tester in conjunction with a diode assembly. The diode assembly is connected to the wires at one end of the conductor and the direct current circuit tester is applied to the wires at the opposite end of the conductor according to a specified procedure to identify or match the corresponding opposite ends of the respective wires. The circuit tester comprises a pair of probes, a direct current power source, and indicator means all electrically connected and operable for indicating the presence of an electrically conductive path connected between the probes. A reversing switch is connected to the probes to permit reversing the polarity thereof, with the reversing switch including a handle portion positioned to facilitate readily actuating the reversing switch by someone using the circuit tester.

10 Claims, 10 Drawing Figures

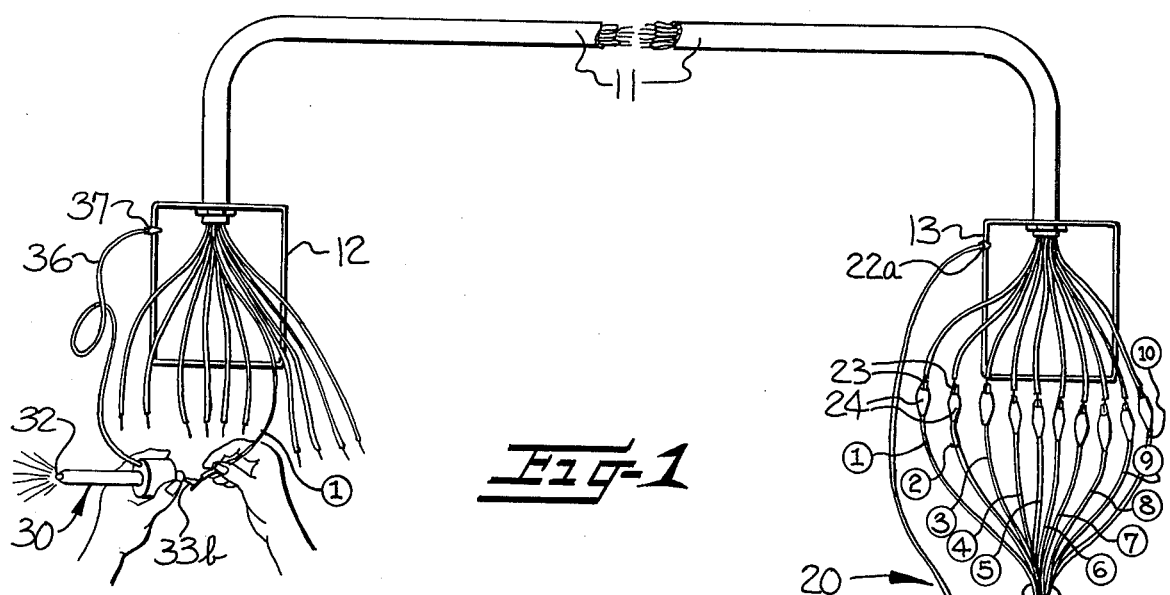
_Fig-1_
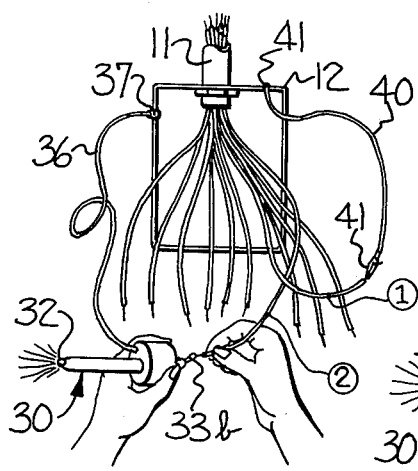
_Fig-2_
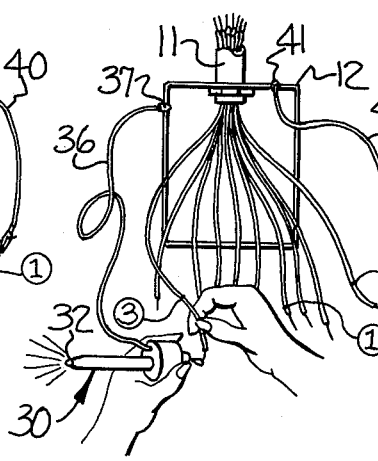
_Fig-3_
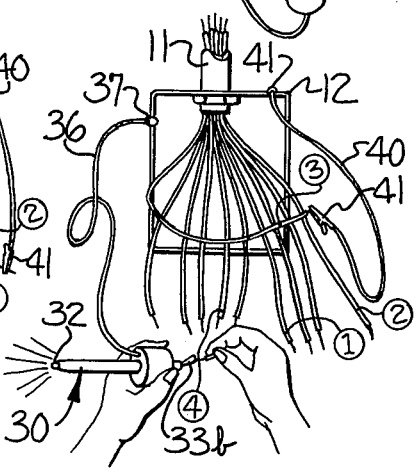
_Fig-4_
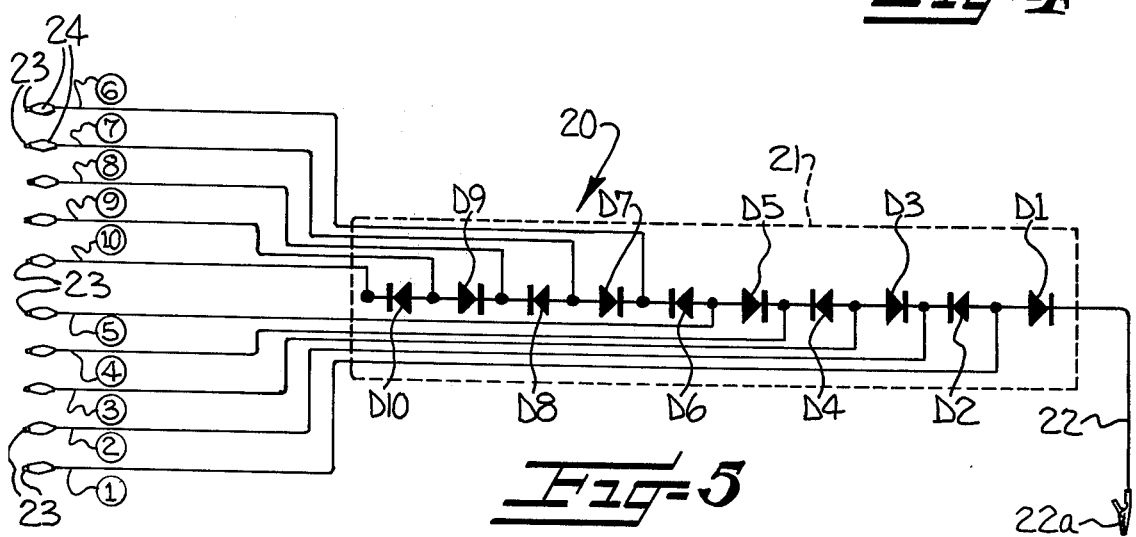
_Fig-5_

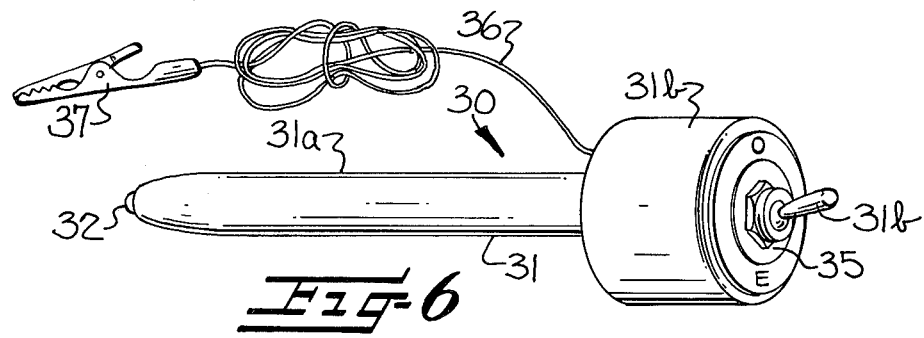
Fig-6
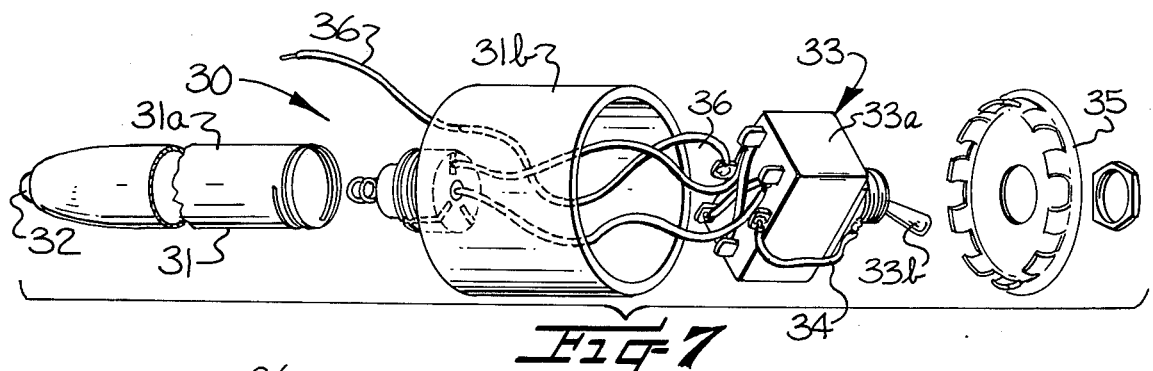
Fig-7
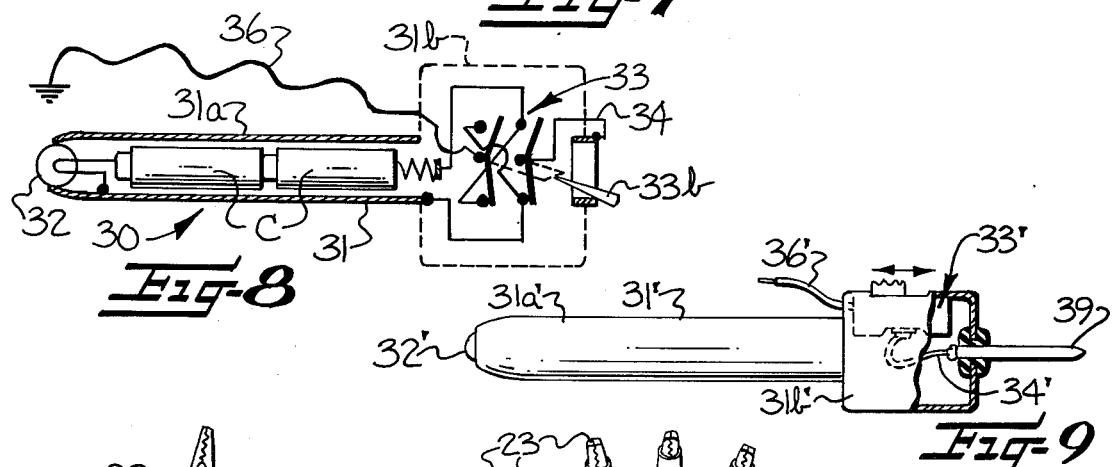
Fig-8
Fig-9
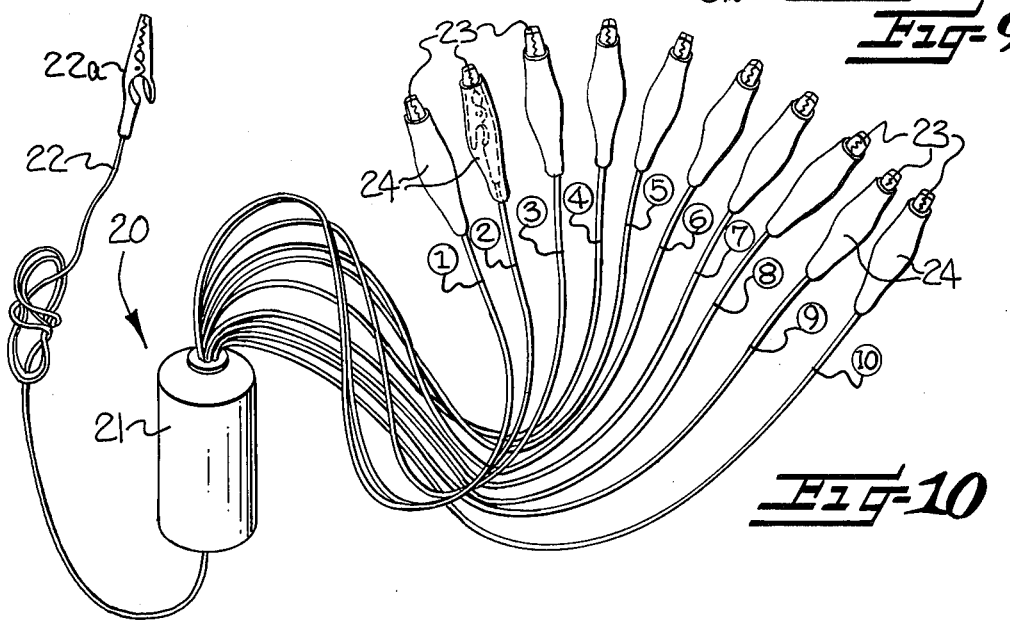
Fig-10

APPARATUS FOR MATCHING WIRES IN MULTIPLE WIRE CONDUCTORS AND ATTENDANT METHOD

This application is a continuation-in-part of my copending application, Serial No. 673,660, filed Apr. 5, 1976, now U.S. Pat. No. 4,041,383, and entitled METHOD FOR MATCHING WIRES IN MULTIPLE WIRE CONDUITS.

When installing a plurality of electrical wires in a conduit, or when making connections to a multi-wire conductor cable, it is necessary that the corresponding opposite end portions of the wires be identified so that the proper electrical connections thereto can be made. In many instances this is done by color coding, employing wires having various colors of insulation. However, where a large number of wires are involved or where the number of available colors is limited, color coding is inadequate.

In such instances, the corresponding opposite ends of the wires must be manually identified. This normally involves two persons working together at opposite ends of the conductor. However, various kinds of devices have been provided for facilitating accomplishing this task, some of which enable a person working alone to identify or match the wires.

By way of example, one known type of device is described in U.S. Pat. No. 2,666,898, and employs resistors connected to the wires at one end of the conductor and an ohmmeter at the opposite end of the conductor. However, this device and the other devices which are commercially available for this purpose generally employ fragile or expensive instruments, such as meters, which can be easily damaged, and are not particularly suited for use on a construction site. Also, the operation of such devices is somewhat complicated, and considerable training, often with an understanding of electronic theory, is necessary before a workman can use the device with any assurance of accuracy.

In my aforementioned earlier filed application, a device and method is disclosed whereby wires in a multi-wire conductor can be identified in a relatively simple manner by an electrician or other workman, without the necessity of sensitive or fragile instruments and much more reliably than with other devices which are commercially available for this purpose.

In the wire identification device and method disclosed in my aforementioned application, a plurality of diodes electrically interconnected in series and in alternating polarity are connected to the wires at one end of the conductor, and a direct current circuit tester is employed in a particular manner at the opposite end of the conduit for accurately identifying and matching the wires. The direct current circuit tester includes a pair of test leads, a battery, and an indicator all electrically interconnected and operable for indicating the occurrence of a complete circuit between the respective test leads.

It is a primary object of the present invention to provide an improvement in the wire identification device and method disclosed in my earlier filed application.

More particularly, it is an object of the present invention to provide a wire identification device of the type described and attendant method of use and in which the direct current circuit tester used at one end of the conductor for identifying and matching the wires is of a unique improved design and adapted to facilitate use by one person in quickly and accurately identifying the wires.

It is another object of the present invention to provide a hand-held circuit tester which may be utilized not only for matching or identifying the wires in a multi-wire conductor, but which may also be utilized in other applications where it is desired to test for the presence of an electrically conductive path between two test points.

The hand-held circuit tester of the present invention comprises a pair of probe means, a direct current power source and indicator means all electrically interconnected and operable for indicating the presence of an electrically conductive path between two test points connected to the respective probe means, and reversing switch means cooperating with the probe means to permit reversing the polarity of the probe means.

As illustrated herein, the circuit tester includes an elongate tubular housing of a size suited to be readily held in one hand by a person using the circuit tester and having a hollow interior portion adapted for receiving at least one battery therein. One of the probe means comprises an elongate electrically conductive probe extending from the housing to facilitate manually contacting the probe to one of the test points, and the other probe means comprises an elongate flexible conductor lead extending from the housing.

In accordance with a preferred embodiment of the invention, the reversing switch means on the circuit tester includes an elongate manually actuable handle portion located at one end of the elongate tubular housing of the circuit tester, with the handle portion of the switch means being electrically conductive and serving as the elongate electrically conductive probe. In accordance with another embodiment of the invention the elongate electrically conductive probe comprises an elongate electrically conductive rod-like member extending from one end of the elongate tubular housing of the circuit tester.

The provision of an elongate electrically conductive probe extending from the elongate tubular housing of the circuit tester makes it very easy to test the unidentified wires of the conduit since the entire tester is compact and can be readily held in one hand of the person testing the wires, while the other hand is used to locate the particular wire which is to be tested and to bring the same into contact with the handle portion of the switch. The dual utilization of the reversing switch handle both as a probe and for actuating the switch, pursuant to the first embodiment of the invention, is particularly advantageous and provides for simplicity of design and ready accessibility of the reversing switch for reversing the polarity of the probe means when desired.

In the preferred form of the invention, the direct current circuit tester includes an elongate tubular housing having a hollow interior portion adapted for receiving one or more flashlight batteries or cells therein to provide a source of direct current electricity for the tester, and having indicator means provided at one end of the elongate housing and a reversing switch provided at the opposite end thereof. The reversing switch has a body portion including a plurality of switch contacts and an electrically conductive handle portion carried by the body portion and extending outwardly from the circuit tester housing and serving as a first probe for contacting one of two test points. A second probe extends from the housing and is preferably in the form of an elongate flexible conductor lead or wire having a clip or other means for releasably connecting the same to the second of two test points. The handle portion of the switch, the conductor wire, the indicator means and the switch contacts are all electrically interconnected so as to be operable to indicate the presence of an electrically conductive path between the handle portion and the conductive wire while also permitting easily reversing the polarity of the respective probe means.

The diode assembly utilized in wire identification procedure in conjunction with the circuit tester includes a plurality of diodes having respective pairs of leads electrically interconnected in series in alternating polarity, means for temporarily connecting the corresponding leads of the respective series interconnected diodes to the respective wires at said one end of the conductor, and means for connecting the remaining free lead of the first diode of the series to a common ground connection.

The method for matching wires in accordance with this invention utilizing the above described preferred form of the circuit tester in conjunction with the diode assembly involves the following steps:

(a) connecting corresponding leads of the respective series-interconnected diodes to a predetermined number of the wires at one end of the conductor, (b) connecting the free lead of the first diode of the series to a common ground connection, (c) connecting the elongate conductor lead of the circuit tester to the common ground connection at the opposite end of the conductor, (d) positioning the polarity reversing switch of the circuit tester so that the conductor lead of the tester has a polarity corresponding to the polarity of the grounded free end of the first diode, (e) contacting the handle portion of the switch means to the respective unidentified wires at the opposite end of the conductor until a wire is located which completes the circuit on the circuit tester, thus indicating a match with the wire connected to the first diode of the series at said one end of the conductor, (f) electrically connecting the thus located wire to the conductor lead of the circuit tester, (g) moving the handle portion of the polarity reversing switch to actuate the switch to thereby reverse the polarity of the probes of the circuit tester, (h) contacting the handle portion of the reversing switch to the then remaining unidentified wires until a wire is located which completes the circuit on the circuit tester, thus indicating a match with the wire connected to the next diode of the series at said one end of the conductor, and (i) repeating steps (f), (g), and (h) until all of the predetermined number of wires have been identified.

Some of the objects and features of the invention having been stated, others will appear as the description proceeds when taken in connection with the accompanying drawings in which FIG. 1 is a view illustrating a conductor conduit with a plurality of wires therein and showing how the device and method of the present invention are employed initially in identifying the opposite ends of a first one of the wires in the multi-wire conductor conduit;

FIG. 2 is a view corresponding to the left-hand portin of FIG. 1 and showing how the device and method are employed for identifying a second wire in the conduit;

FIG. 3 is a view similar to FIG. 2 and showing how the device and method are employed for identifying a third wire in the conduit;

FIG. 4 is a view similar to FIG. 2 and showing how the device and method are employed for identifying a fourth wire in the conduit;

FIG. 5 is a schematic wiring diagram of the diode assembly;

FIG. 6 is a perspective view showing the side and one end of the direct current circuit tester in accordance with one embodiment of the invention;

FIG. 7 is an exploded perspective view of the circuit tester of FIG. 6 showing how the components thereof are electrically interconnected;

FIG. 8 is a schematic wiring diagram of the direct current circuit tester of FIG. 6;

FIG. 9 is an elevational view, with parts broken away, showing a direct current circuit tester in accordance with a second embodiment of the invention; and FIG. 10 is a perspective view showing the diode assembly.

Referring now more particularly to the drawings, a conventional electrical conductor conduit 11 of the type conventionally used in many commercial or industrial electrical wiring installations is illustrated in FIG. 1 with junction boxes 12, 13 located at opposite ends of the conduit. In the illustrated embodiment, conduit 11 and junction boxes 12, 13 are of electrically conductive material. Ten wires run through the conduit 11 with opposite end portions of the wires extending from the junction boxes 12 and 13. A diode assembly 20 is connected to the wires at one end of the conduit, and a direct current circuit tester 30 is shown being manually applied to the wires at the opposite end of the conduit.

As illustrated, the diode assembly 20 has a cylindrical housing 21 with a plurality of leads extending from one end of the housing, in this instance 10 leads identified in FIG. 1 by tags respectively numbered 1 to 10. A single lead 22 extends from the opposite end of housing 21 and is connected to ground by suitable means such as an alligator clip 22a. Each of the other leads is provided with means, such as a conventional alligator clip 23, to facilitate connecting the lead to a wire of the conduit. As best seen in FIG. 10 the ten numbered leads are provided with insulating jackets 24 of plastic or other suitable non-conductive material which serve to prevent the respective clips from inadvertently contacting one another when applied to a large number of wires in a closely confined space.

The diodes in the diode assembly are electrically interconnected in a manner similar to that employed in the continuity tester of Soviet Union description of invention No. 130,580, published in 1960. Referring to FIG. 5 it will be seen that the housing 21 of the diode assembly 20 contains ten diodes D1 to D10 having respective pairs of leads and electrically interconnected in series and in alternating polarity. The single lead 22 is connected to the remaining free one of the leads of the first diode D1 of the series. To the other side of the diode D1 is connected the lead labelled as number "1". Similarly, corresponding leads of the remaining diodes D2 to D10 have correspondingly numbered leads "2" to "10" connected thereto.

Referring now to the circuit tester 30, in the preferred form of the apparatus as illustrated in FIG. 6 and 7, the circuit tester includes an elongate tubular housing 31 with indicator means such as a light bulb 32 provided at one end of the housing and with a reversing switch 33 provided at the opposite end thereof. While a light bulb has been shown herein as the indicator means, other types of indicators such as buzzers, etc. may be suitably employed, if desired. As illustrated, the tubular housing includes an elongate reduced diameter portion 31a having a hollow interior portion therein adapted for receiving one or more flashlight batteries therein and with an enlarged diameter cylindrical portion 31b in which the switch 33 is mounted. In the embodiment illustrated the elongate reduced diameter portion 31a is of a form similar to a pen light flashlight and is adapted for receiving therein a battery comprising two pen light size flashlight cells C. The enlarged cylindrical portion 31b of the housing 31 is adapted for receiving the reversing switch 33, with an end cap 35 serving to mount the switch in position at the end of the housing while closing the open end of the housing. As illustrated the switch is a double pole double throw (DPDT) toggle switch including a body portion 33a with the respective switch contacts extending therefrom, and with an electrically conductive handle portion 33b extending from the body portion. The electrically conductive handle portion 33b of the switch is utilized as one of the test probes by connecting a wire 34 from one of the two common switch contacts of the DPDT switch to the base of the switch handle. The other test probe is in the form of an elongate flexible conductor lead 36 with an alligator clip 37 or other suitable temporary connector thereon. The two probes are connected to the two centrally located common terminals of the DPDT polarity reversing switch, with the other terminals being electrically cross-connected as shown in FIG. 7 so as to provide for reversing the polarity of the probes upon throwing the switch from one position to another. The flashlight cells C and bulb 32 are electrically connected in series to the probes through the reversing switch 33.

In performing the method of this invention, it is first necessary to install the diode assembly 20 at one end of the conduit. This is accomplished by connecting the unidentified wires to the respective leads 1 to 10 of the diode assembly 20 and connecting the single lead 22 to a common ground connection. As illustrated, lead 22 is connected to the grounded junction box 13. However, any known conductor will suffice. Thus, where conduit 11 or the junction box 12 is of a non-conductive material, the lead 22 may be suitably connected to a previously identified bonding conductor or ground wire, such as is normally provided in the conduit during installation of the other wires pursuant to most code requirements.

The preferred practice in accordance with the invention is to label all of the wires at this end of the conduit at the time the diode assembly is installed. Numbered tags or self-adhesive labels may be suitably employed, the numbers preferably corresponding to the numbers of the respective leads 1 to 10. In a later step in the method similar labels may be applied to the corresponding opposite end portions of the wires at the opposite end of the conduit so that the opposite end portions of each wire in the conduit will be identified by a correspondingly numbered label.

Once the diode assembly 20 is installed, the workman can go to the opposite end of the conduit and proceed to identify the wires using the circuit tester 30 in the manner described as follows:

The elongate conductor lead 36 of the circuit tester is connected to the common ground connection and the electrically conductive handle portion 33b of the switch is applied to the respective unidentified wires until the indicator bulb 32 ignites and signals a complete circuit. The wire thus located corresponds to the wire labeled as number 1 at the opposite end of the conduit and may be appropriately labeled as such. It is usually necessary to individually and successively contact the handle portion 33b to a number of the unidentified wires until the appropriate wire is located. However, it will be appreciated that sometimes, by chance, the first wire contacted with the handle portion of the tester causes the indicator bulb to ignite. In such event it is not necessary to test the remaining unidentified wires.

The conductor lead 36 which is connected to the ground must correspond in polarity to the polarity of the grounded side of the first diode D1. This is accomplished in the illustrated apparatus by initially setting the polarity reversing switch to the position labeled "O" for "odd" since the first wire being identified (number 1) is an odd number.

After the first wire is thus identified, the polarity reversing switch is moved from the "odd" position to the position labeled "E" for "even" since the wire now being located (number 2) is an even number. The previously identified wire (number 1) is electrically connected to the conductor lead 36 of the circuit tester and then the handle portion 33b of the switch is again applied to the then remaining unidentified wires until a wire is located which completes the circuit on the circuit tester, thus indicating a match with the wire connected to the next diode of the series at the opposite end of the conduit.

A preferred and most convenient way to connect the previously identified wire to the conductor lead 36 of the circuit tester is illustrated in FIGS. 2 to 4, and utilizes a relatively short piece of wire 40 having alligator clips 41 or other suitable releasable connecting means provided at opposite ends thereof. In accordance with this method the conductor lead 36 of the circuit tester 30 is left connected to the grounded junction box 12. One end of the grounding wire 40 is also connected to the grounded junction box, and the alligator clip 41 at the other end is connected to the previously identified wire as is illustrated in FIGS. 2 to 4. In these Figures it will be seen that only the last identified wire is connected to the short grounding wire 40. However, if desired, all of the identified wires may be clipped to the free alligator clip 41 of the grounding wire 40 to thereby move these previously identified wires out of the way and leave only the unidentified wires available for testing.

The construction of the direct current circuit tester pursuant to a second embodiment of the invention, as illustrated in FIG. 8, is similar in many respects to the embodiment previously described with reference to FIGS. 1 to 7. Accordingly, to avoid repetitive description the parts corresponding with those previously described will be identified, whenever possible, by corresponding reference characters with prime notation added.

Basically, the circuit tester in accordance with this form of the invention differs from the embodiment previously described in that a DPDT slide switch 33' is utilized instead of a toggle switch, and the slide switch is mounted on the side of the tubular housing 31' readily accessible to the thumb of the person using the tester. Instead of utilizing the handle portion of the switch as a test probe, the elongate electrically conductive probe is in the form of an elongate rod-like member 39 extending from one end of the elongate tubular housing 31' and being positioned so as to facilitate manually contacting the probe member 39 to the wires being tested without requiring the person using the circuit tester to change his grip on the tester.

While the device and method of this invention has been specifically illustrated and described herein with reference to matching wires in a multi-wire conductor conduit of the type conventionally used in commercial and industrial electrical wiring, those skilled in the art will recognize that this invention is useful for identifying or matching wires in numerous other applications, as for example in identifying or matching wires in a multi-wire cable, such as a communications cable.

The device and method of this invention may be employed for identifying any number of wires. Thus, when the number of wires to be identified is less than the number of available leads on the diode assembly, only the lowest numbered leads are employed, the leads having numbers higher than the number of wires to be identified being left unconnected.

When the number of wires to be identified exceeds the available number of leads on the diode assembly 20, one of several approaches may be used to identify the wires. In accordance with one approach, one or more additional diode assemblies may be connected in series to provide the requisite number of leads. This is accomplished, for example, by connecting the first diode assembly in the manner previously described, and connecting the single lead 22 of each additional diode assembly to the highest numbered lead (e.g., 10) of the previous diode assembly.

In accordance with another approach, the wires may be identified in groups utilizing a single diode assembly. For example, if there are 50 wires to be identified, the wires may be assembled into five groups of ten wires each. This may be done by twisting the wires together or otherwise suitably interconnecting the wires. The five groups of wires are then connected to the first five leads of the diode assembly. At the opposite end of the conduit the procedure described above is carried out on each of the unidentified wires so as to thereby identify each of the wires as belonging to one of the five groups. Then each identified group of ten wires may be further identified utilizing the procedure described previously to thereby individually identify each of the wires in each of the groups.

In the drawings and specification, there have been set forth preferred embodiments of the invention, and although specific terms are employed, they are used in a generic and descriptive sense only and not for purposes of limitation.

That which is claimed is:

1. Apparatus for matching the corresponding opposite end portions of wires located at opposite ends of a multi-wire conductor, said apparatus being particularly suited for operation by one person, thereby avoiding the necessity of having persons at both ends of the conductor for matching and identifying the wires, said apparatus comprising, in combination, a diode assembly adapted to be connected to the respective wires at one end of the conductor and a direct current circuit tester adapted to be employed at the opposite end of the conductor to test the respective wires for a complete circuit, thus indicating a match with a particular one of the wires at the opposite end of the conductor; said diode assembly including a plurality of diodes having respective pairs of leads and electrically interconnected in series in alternating polarity, means for temporarily connecting corresponding leads of the respective series-interconnected diodes to the respective wires at one end of the conductor, and means for connecting the remaining free lead of the first diode of the series to a common ground connection; said direct current circuit tester including an elongate tubular housing of a size suited to be readily held in one hand by a person using the circuit tester and having a hollow interior portion adapted for receiving at least one battery therein, a pair of probe means and an indicator means carried by the housing and being operably interconnected for cooperating with a battery received in said housing and indicating the presence of an electrically conductive path connected between the respective probe means, reversing switch means operably associated with said probe means and carried by the housing and including a manually actuable handle portion located at one end of the housing for effecting reversing of the polarity of said probe means, and wherein the handle portion of said switch means is electrically conductive and comprises one of said probe means and the other of said probe means comprising an elongate flexible conductor lead extending from said housing.

2. Apparatus according to claim 1 wherein said elongate flexible conductor lead of said circuit tester is adapted to be connected to said common ground connection, and wherein the apparatus further comprises a separate elongate flexible conductor wire, one end of the wire being adapted to be connected to said common ground connection, the other end of the wire being adapted to be connected to at least one of the wires at the proximal end of the conductor.

3. Apparatus for matching the corresponding opposite end portions of wires located at opposite ends of a multi-wire conductor, said apparatus being particularly suited for operation by one person, thereby avoiding the necessity of having persons at both ends of the conductor for matching and identifying the wires, said apparatus comprising, in combination, a diode assembly adapted to be connected to the respective wires at one end of the conductor and a direct current circuit tester adapted to be employed at the opposite end of the conductor to test the respective wires for a complete circuit, thus indicating a match with a particular one of the wires at the opposite end of the conductor; said diode assembly including a plurality of diodes having respective pairs of leads and electrically interconnected in series in alternating polarity, means for temporarily connecting corresponding leads of the respective series-interconnected diodes to the respective wires at one end of the conductor, and means for connecting the remaining free lead of the first diode of the series to a common ground connection; said direct current circuit tester including a pair of probe means, a direct current power source, and indicator means all electrically interconnected and operable for indicating the presence of an electrically conductive path connected between the respective probe means, reversing switch means cooperating with said probe means to permit reversing the polarity of the probe means, said reversing switch means including a handle portion positioned to facilitate readily actuating the reversing switch by someone using the circuit tester, and wherein the handle portion of said switch means is electrically conductive and comprises one of said probe means.

4. Apparatus according to claim 3 wherein the other of said probe means comprises an elongate flexible conductor lead extending from said circuit tester, with means provided at the end of said conductor lead to facilitate connecting the conductor lead to one or more of the wires at the proximal end of the conductor.

5. Apparatus according to claim 3 wherein said circuit tester includes an elongate tubular housing having a hollow interior portion adapted for receiving said direct current power source therein, said indicator means being located at one end of the elongate housing and said reversing switch means being located at the opposite end of the housing and with said electrically conductive handle portion thereof extending outwardly from the housing to facilitate manually contacting the same to the unidentified wires at the proximal end of the conductor.

6. A hand-held circuit tester adapted to test for the presence of an electrically conductive path between two test points, said circuit tester comprising a pair of probe means, a direct current power source, and indicator means all electrically interconnected and operable for indicating the presence of an electrically conductive path between two test points connected to the respective probe means, reversing switch means cooperating with said probe means to permit reversing the polarity of the probe means, said reversing switch means including a handle portion positioned to facilitate readily actuating the reversing switch by someone using the circuit tester, and wherein the handle portion of said switch means is electrically conductive and comprises one of said probe means.

7. A circuit tester according to claim 6 wherein the other of said probe means comprises an elongate flexible conductor lead extending from said circuit tester, with means provided at the end of said conductor lead to facilitate connecting the conductor lead to one of the test points.

8. A hand-held circuit tester adapted to test for the presence of an electrically conductive path between two test points, said circuit tester comprising an elongate tubular housing having a hollow interior portion adapted for receiving at least one battery therein and having indicator means provided at one end of the elongate housing and reversing switch means provided at the opposite end thereof, said reversing switch means having a body portion including a plurality of switch contacts and an electrically conductive handle portion carried by the body portion and extending outwardly from said housing and serving as a first probe for contacting one of the two test points, a second probe extending from said housing and being adapted for contacting the second of two test points, and means adapted to cooperate with a battery received in said housing and electrically interconnecting the handle portion of said switch, said second probe means, said indicator means, and the contacts of said switch so that the indicator means serves to indicate the presence of an electrically conductive path between said handle portion and said second probe means, while the switch is also operable for permitting reversing the polarity of the respective probe means.

9. A method for matching the corresponding opposite end portions of wires located at opposite ends of a multi-wire conductor with the use of a direct current circuit tester in conjunction with a plurality of diodes, the diodes having respective pairs of leads and being electrically interconnected in series in alternating polarity, and the circuit tester including a direct current power source, an indicator, and a pair of probes connected thereto, with a polarity reversing switch connected to the probes for reversing the polarity of the probes and wherein the handle portion of the switch is electrically conductive and comprises one of the probes and the other of the probes comprises an elongate conductor lead, said method being particularly suited for practice by one person, thereby avoiding the necessity of having persons at both ends of the conductor, and said method comprising (a) connecting corresponding leads of the respective series-interconnected diodes to a predetermined number of the wires at one end of the conductor, (b) connecting the free lead of the first diode of the series to a common ground connection, (c) connecting the elongate conductor lead of the circuit tester to the common ground connection at the opposite end of the conductor, (d) positioning the polarity reversing switch of the circuit tester so that the conductor lead has a polarity corresponding to the polarity of the grounded free end of the first diode at the opposite end of the conductor, (e) contacting the handle portion of the reversing switch to the respective unidentified wires at said opposite end of the conductor until a wire is located which completes the circuit on the circuit tester, thus indicating a match with the wire connected to the first diode of the series at said one end of the conductor, (f) electrically connecting the thus located wire to the elongate conductor lead of the circuit tester, (g) moving the handle portion of the polarity reversing switch to actuate the switch and thereby reverse the polarity of the probes of the circuit tester, (h) contacting the handle portion of the reversing switch to the then remaining unidentified wires until a wire is located which completes the circuit on the circuit tester, thus indicating a match with the wire connected to the next diode of the series at said one end of the conductor, and (i) repeating steps (f), (g) and (h) until all of the predetermined number of wires have been identified.

10. A method according to claim 9 wherein step (f) comprises utilizing a grounding wire connected to the common ground connection at the opposite end of the conductor and connecting the wire identified in step (e) to such grounding wire while leaving the elongate conductor lead of the circuit tester connected to the common ground connection.